United States Patent
Mo

(10) Patent No.: US 11,251,202 B2
(45) Date of Patent: Feb. 15, 2022

(54) THIN FILM TRANSISTOR (TFT) ARRAY SUBSTRATE AND DISPLAY PANEL

(71) Applicant: SHENZHEN CHINA STAR OPTOELECTRONICS TECHNOLOGY CO., LTD., Shenzhen (CN)

(72) Inventor: Chaode Mo, Shenzhen (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 187 days.

(21) Appl. No.: 16/607,191

(22) PCT Filed: May 28, 2019

(86) PCT No.: PCT/CN2019/088692
§ 371 (c)(1),
(2) Date: Oct. 22, 2019

(87) PCT Pub. No.: WO2020/228058
PCT Pub. Date: Nov. 19, 2020

(65) Prior Publication Data
US 2021/0335832 A1  Oct. 28, 2021

(30) Foreign Application Priority Data
May 15, 2019 (CN) .......................... 201910402429.6

(51) Int. Cl.
*H01L 27/12* (2006.01)
*G02F 1/1335* (2006.01)
(Continued)

(52) U.S. Cl.
CPC ........ *H01L 27/1218* (2013.01); *G02F 1/1368* (2013.01); *G02F 1/133502* (2013.01);
(Continued)

(58) Field of Classification Search
CPC ............ H01L 27/1218; H01L 27/1262; H01L 29/4908; G02F 1/133502; G02F 1/1368; G02F 1/136222; G02F 1/133514
(Continued)

(56) References Cited

U.S. PATENT DOCUMENTS

2015/0087093 A1*  3/2015  Sakano ............... H01L 51/0024
                                                      438/27
2017/0104048 A1*  4/2017  Chung ................ H01L 27/3262
(Continued)

FOREIGN PATENT DOCUMENTS

CN          205319159 U      6/2016
CN          107045221 A      8/2017
(Continued)

*Primary Examiner* — Charles S Chang

(57) ABSTRACT

A thin film transistor (TFT) array substrate and a display panel are provided. The TFT array substrate has a base substrate, an anti-reflection layer, and a gate electrode insulating layer. The TFT array substrate has a light-transmitting region. The anti-reflection layer is disposed on the base substrate of the light-transmitting region. The gate electrode insulating layer is disposed on the anti-reflection layer. Light refractive indexes of the base substrate, the anti-reflection layer, and the gate electrode insulating layer are increasing sequentially.

12 Claims, 3 Drawing Sheets

(51) Int. Cl.
*G02F 1/1368* (2006.01)
*G02F 1/1362* (2006.01)
*H01L 29/49* (2006.01)

(52) U.S. Cl.
CPC .... *H01L 27/1262* (2013.01); *G02F 1/133514* (2013.01); *G02F 1/136222* (2021.01); *H01L 29/4908* (2013.01)

(58) Field of Classification Search
USPC .......................................................... 349/137
See application file for complete search history.

(56) References Cited

U.S. PATENT DOCUMENTS

2017/0357125 A1* 12/2017 Tojo .................... G02F 1/13439
2018/0210286 A1    7/2018 Hai
2019/0123149 A1*  4/2019 Lee ..................... H01L 29/7786

FOREIGN PATENT DOCUMENTS

| CN | 108508648 A | 9/2018 |
| CN | 109116615 A | 1/2019 |
| CN | 109656054 A | 4/2019 |
| JP | 2013037048 A | 2/2013 |

* cited by examiner backlight source

THIN FILM TRANSISTOR (TFT) ARRAY SUBSTRATE AND DISPLAY PANEL

FIELD OF DISCLOSURE

The present disclosure relates to display panels, and more particularly to a thin film transistor (TFT) array substrate and a display panel.

BACKGROUND OF DISCLOSURE

Description herein merely provide background information related to the present application and do not necessarily constitute the prior art.

Most of liquid crystal display devices in markets are backlight-type liquid crystal display devices, which include a liquid crystal display panel and a backlight module. The liquid crystal display panel itself does not emit light, and a light source must be provided through the backlight module. The liquid crystal display panel generally includes a thin film transistor (TFT) array substrate, a color filter (CF) substrate, and a liquid crystal layer disposed between the two substrates. A working principle is to control rotation of liquid crystal molecules of the liquid crystal layer by applying a driving voltage on the two substrates so as to refract light of the backlight module to generate a picture.

Generally, a backlight source is incident from a side of the TFT array substrate and exits from a side of the CF substrate. When the backlight source is incident onto a contact interface between a base substrate of the TFT array substrate and a gate electrode insulating layer, there is a high light reflection phenomenon at a contact interface, which reduces transmittance of the backlight source. Moreover, with development trend of large-size and high-resolution technologies, a pixel density of the liquid crystal display panels is increasing. For high pixel density display panels, a pixel design is small and an aperture ratio is low. Therefore, high reflection of incident light at the contact interface between the base substrate and the gate electrode insulating layer causes a relatively great loss of the backlight, such that the transmittance of the backlight source on the TFT array substrate is relatively low.

SUMMARY OF DISCLOSURE

The present application provides a thin film transistor (TFT) array substrate and a display panel by disposing an anti-reflection layer between a base substrate of the TFT array substrate and a gate electrode insulating layer and by disposing the anti-reflection layer between the base substrate and a gate electrode layer, wherein the anti-reflection layer has a refractive index between a refractive index of the base substrate and a refractive index of the gate electrode insulating layer so as to solve a technical problem that transmittance of a backlight source on the TFT array substrate is low.

To solve the above problem, technical solutions of the present application are provided as follows.

An embodiment of the present application provides a TFT array substrate comprising a base substrate, an anti-reflection layer, and a gate electrode insulating layer, wherein the TFT array substrate comprises a light-transmitting region, the anti-reflection layer is disposed on the base substrate located in the light-transmitting region, and the gate electrode insulating layer is disposed on the anti-reflection layer, wherein light refractive indexes of the base substrate, the anti-reflection layer, and the gate electrode insulating layer are increasing sequentially.

In a TFT array substrate provided by an embodiment of the present application, the TFT array substrate further comprises a non-light-transmitting region, wherein the anti-reflection layer is further disposed on the base substrate located in the non-light-transmitting region, a gate electrode layer is disposed on the anti-reflection layer located in the non-light-transmitting region, and the gate electrode insulating layer is further disposed on the gate electrode layer.

In a TFT array substrate provided by an embodiment of the present application, the TFT array substrate further comprises a semiconductor layer, a source/drain electrode layer, a passivation layer, and a pixel electrode layer disposed on the gate electrode insulating layer sequentially.

In a TFT array substrate provided by an embodiment of the present application, the gate electrode insulating layer further comprises a first gate electrode insulating layer and a second gate electrode insulating layer disposed on the gate electrode layer sequentially, wherein material of the first gate electrode insulating layer and material of the second gate electrode insulating layer are different.

In a TFT array substrate provided by an embodiment of the present application, material of the first gate electrode insulating layer and material of the second gate electrode insulating layer comprise silicon nitride or silicon In a TFT array substrate provided by an embodiment of the present application, the anti-reflection layer comprises a plurality of film layers stacked on the base substrate sequentially, each of the film layers having a light refractive index greater than a light refractive index of the base substrate and smaller than a light refractive index of the gate electrode insulating layer, wherein the refractive indexes of the plurality of film layers are increasing layer by layer in a direction toward the gate electrode insulating layer.

In a TFT array substrate provided by an embodiment of the present application, material of each of the plurality of film layers comprises any one of silicon oxynitride, aluminum oxide, and a resin compound.

In a TFT array substrate provided by an embodiment of the present application, a light refractive index of the anti-reflection layer is $n=\sqrt{n_1 n_2}$, wherein n is the light refractive index of the anti-reflection layer, $n_1$ is a light refractive index of the base substrate, and $n_2$ is a light refractive index of the gate electrode insulating layer.

In a TFT array substrate provided by an embodiment of the present application, a thickness of the anti-reflection layer is $$e = \frac{\lambda}{4n}(2k+1),$$

wherein e is the thickness of the anti-reflection layer, k is a natural number, and λ is a wavelength of green light having a wavelength of 550 nm.

In a TFT array substrate provided by an embodiment of the present application, the non-light-transmitting region comprises a first non-light-transmitting region and a second non-light-transmitting region, the gate electrode layer comprises a gate electrode and a first metal electrode, and the source/drain electrode layer comprises a source electrode, a drain electrode, and a second metal electrode, wherein the TFT array substrate located in the first non-light-transmitting region comprises the anti-reflection layer, the gate electrode, the gate electrode insulating layer, the semiconductor layer, the source electrode, the drain electrode, the passivation layer, and the pixel electrode layer, all of which are disposed on the base substrate sequentially, and the TFT array substrate located in the second non-light-transmitting region comprises the anti-reflection layer, the first metal electrode, the gate electrode insulating layer, the second metal electrode, the passivation layer, and the pixel electrode layer, all of which are disposed on the base substrate sequentially.

In a TFT array substrate provided by an embodiment of the present application, a fabrication process of the anti-reflection layer comprises a magnetron sputtering process or a vapor deposition process.

An embodiment of the present application further provides a display panel comprising the TFT array substrate described above; and a color filter substrate cell-assembled to the TFT array substrate.

An embodiment of the present application further provides a display panel comprising the TFT array substrate described above; and a color resist layer disposed on the TFT array substrate.

Beneficial Effects

The beneficial effects of the present application are as follows: the present application provides an anti-reflection layer between the base substrate and the gate electrode insulating layer located in the light-transmitting region of the TFT array substrate. Refractive indexes of the base substrate, the anti-reflection layer, and the gate electrode insulating layer are increasing sequentially, so that a backlight source in the light-transmitting region of the TFT array substrate enters an optically denser medium from an optically thinner medium to form a half-wave loss, so as to reduce reflected light energy. Therefore, a high reflection phenomenon of the backlight source at a contact interface between the base substrate and the gate electrode insulating layer with large difference in refractive index is avoided. Reflectivity of the backlight source at each contact interface of the light-transmitting region is reduced, thereby improving the transmittance of the backlight source in the light-transmitting region of the TFT array substrate. In addition, the anti-reflection layer is also disposed between the base substrate and the gate electrode layer located in the non-transmitting region of the TFT array substrate, which increases number of contact interfaces between the base substrate and the gate electrode layer. The backlight source cannot pass through the gate electrode layer originally, but after the backlight source is reflected by the contact interfaces between the base substrate and the anti-reflection layer and by the contact interfaces between the anti-reflection layer and the gate electrode layer many times, a part of the backlight source pass through the light-transmitting region of the TFT array substrate. The transmittance of the backlight source in the light-transmitting region of the TFT array substrate is further improved.

DESCRIPTION OF DRAWINGS

In order to more clearly describe embodiments of the present disclosure or technical solutions in a conventional technology, drawings required to be used for the embodiments or descriptions of the conventional technology are simply described hereinafter. Apparently, the drawings described below only illustrate some embodiments of the present application. Those skilled in the art can obtain other drawings based on these drawings disclosed herein without creative effort.

DETAILED DESCRIPTION OF PREFERRED EMBODIMENTS

Figure 1:
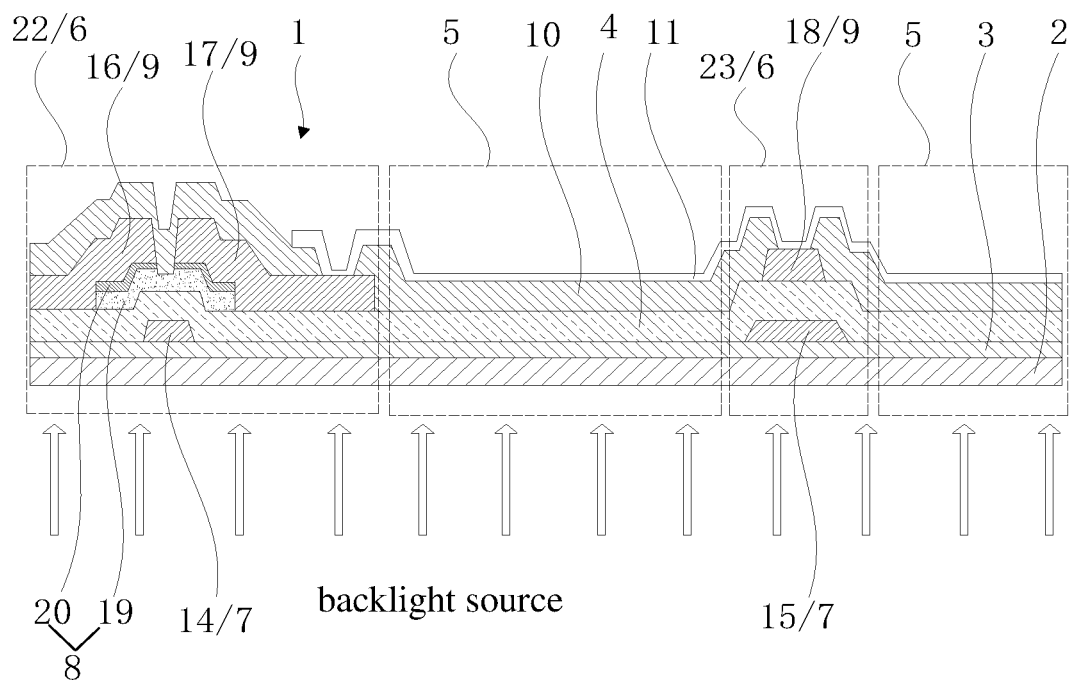
FIG. 1 is a structural schematic diagram of a thin film transistor (TFT) array substrate provided by an embodiment of the present application.

The specific structures and functional details disclosed herein are merely representative and are for purposes of describing exemplary embodiments of the present application. The present application, however, may be embodied in many alternative forms and should not be construed as being limited to the embodiments set forth herein.

In the description of the present application, it is to be understood that the terms of the orientation or positional relationship such as "center", "lateral", "upper", "lower", "left", "right", "vertical", "horizontal", "top", "bottom", "inside", "outside", and the like, are based on the orientation or positional relationship shown in the drawings, and are merely for convenience of description of the present application and simplified description, instead of indicating or implying that the device or component referred to must have a particular orientation or be constructed and operated in a particular orientation. Therefore, it is not to be construed as limiting the disclosure. Moreover, the terms of "first" and "second" are used for descriptive purposes only and are not to be understood as indicating or implying a relative importance or implicitly indicating the number of technical features indicated. Thus, features defining "first" and "second" may include one or more of the features either explicitly or implicitly. In the description of the present application, "a plurality" means two or more than two, unless otherwise stated. In addition, the term of "comprises" and its variations are intended to cover a non-exclusive inclusion.

In the description of the present application, it should be noted that the terms of "install", "connect with each other", and "connect" are to be understood broadly, and they may be a fixed connection, a detachable connection, or an integral connection; it may be a mechanical connection or an electrical connection; it may be directly connected, or it can also be connected indirectly through an intermediate medium, which can be an internal communication between two components. The specific meanings of the above terms in the present application can be understood in the specific circumstances for those skilled in the art.

The terminology used herein is for the purpose of describing the particular embodiments. Unless the context clearly indicates otherwise, a singular form of "a" or "one" used herein is also intended to include the plural. It is also to be understood that the terms of "comprise" and/or "include", used herein, are intended to mean the presence of the recited features, integers, steps, operations, units and/or components, and one or more other features, integers, steps, operations, units, components, and/or combinations thereof are not excluded.

The present application will be further described below in conjunction with the accompanying drawings and embodiments.

Figure 2:
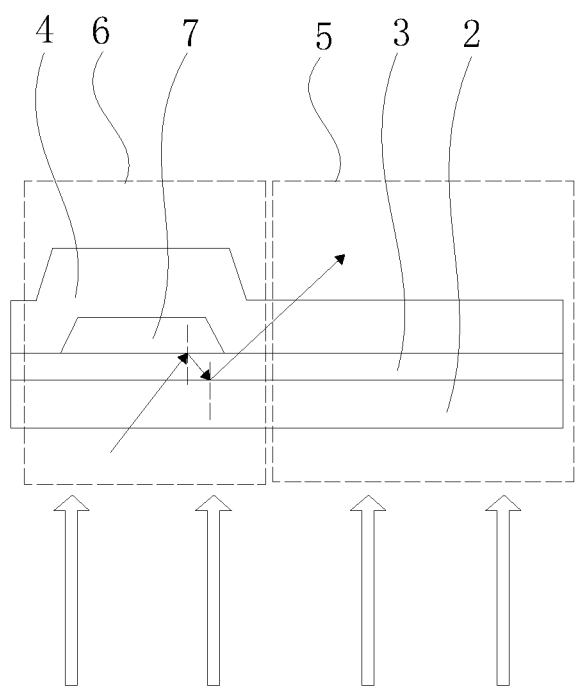
FIG. 2 is a partially structural schematic diagram of a thin film transistor (TFT) array substrate provided by an embodiment of the present application.

As shown in FIG. 1 and FIG. 2, an embodiment of the present application provides a thin film transistor (TFT) array substrate 1 comprising a base substrate 2, an anti-reflection layer 3, and a gate electrode insulating layer 4. The TFT array substrate 1 comprises a light-transmitting region 5. The anti-reflection layer 3 is disposed on the base substrate 2 located in the light-transmitting region 5. The gate electrode insulating layer 4 is disposed on the anti-reflection layer 3, wherein light refractive indexes of the base substrate 2, the anti-reflection layer 3, and the gate electrode insulating layer 4 are increasing sequentially.

Specifically, the TFT array substrate 1 located in the light-transmitting region 5 comprises a passivation layer 10 and a pixel electrode layer 11 disposed on the gate electrode insulating layer 4 sequentially. A backlight source provides a light source from a side of the base substrate 2 of the TFT array substrate 1 to a direction of the pixel electrode layer 11.

In the present embodiment, an anti-reflection layer 3 is disposed between the base substrate 2 and the gate electrode insulating layer 4 located in the light-transmitting region 5 of the TFT array substrate 1. Refractive indexes of the base substrate 2, the anti-reflection layer 3, and the gate electrode insulating layer 4 are increasing sequentially, so that a backlight source in the light-transmitting region 5 of the TFT array substrate 1 enters an optically denser medium from an optically thinner medium to form a half-wave loss so as to reduce reflected light energy. Therefore, a high reflection phenomenon of the backlight source at a contact interface between the base substrate 2 and the gate electrode insulating layer 4 with large difference in refractive index is avoided. Reflectivity of the backlight source at contact interface of the light-transmitting region 5 is reduced, thereby improving the transmittance of the backlight source in the light-transmitting region 5 of the TFT array substrate 1.

In an embodiment, the TFT array substrate 1 further comprises a non-light-transmitting region 6. The anti-reflection layer 3 is further disposed on the base substrate 2 located in the non-light-transmitting region 6. A gate electrode layer 7 is disposed on the anti-reflection layer 3 located in the non-light-transmitting region 6. The gate electrode insulating layer 4 is further disposed on the gate electrode layer 7.

Specifically, the TFT array substrate 1 further comprises a semiconductor layer 8 (including an a-Si semiconductor active layer 19 and an n+ a-Si ohmic contact layer 20), a source/drain electrode layer 9, a passivation layer 10, and a pixel electrode layer 11 disposed on the gate electrode insulating layer 4 sequentially.

In the present embodiment, the anti-reflection layer 3 is also disposed between the base substrate 2 and the gate electrode layer 7 located in the non-transmitting region 6 of the TFT array substrate 1, which increases number of contact interfaces between the base substrate 2 and the gate electrode layer 7, as shown in FIG. 2. The backlight source cannot pass through the gate electrode layer 7 originally, but after the backlight source is reflected by the contact interfaces between the base substrate 2 and the anti-reflection layer 3 and by the contact interfaces between the anti-reflection layer 3 and the gate electrode layer 7 many times, a part of the backlight source pass through the light-trans-mitting region 5 of the TFT array substrate 1. The transmittance of the backlight source in the light-transmitting region 5 of the TFT array substrate 1 is further improved.

In an embodiment, the non-light-transmitting region 6 comprises a first non-light-transmitting region 22 and a second non-light-transmitting region 23. The gate electrode layer 7 comprises a gate electrode 14 and a first metal electrode 15 (scan lines), both of which are formed in a same process. The source/drain electrode layer 9 comprises a source electrode 16, a drain electrode 17, and a second metal electrode 18 (data lines), all of which are formed in a same process. The TFT array substrate 1 located in the first non-light-transmitting region 22 comprises: the base substrate 2; and the anti-reflection layer 3, the gate electrode 14, the gate electrode insulating layer 4, the semiconductor layer 8, the source electrode 16, the drain electrode 17, the passivation layer 10, and the pixel electrode layer 11, all of which are disposed on the base substrate 2 sequentially. The TFT array substrate 1 located in the second non-light-transmitting region 23 comprises the base substrate 2; and the anti-reflection layer 3, the first metal electrode 15, the gate electrode insulating layer 4, the second metal electrode 18, the passivation layer 10, and the pixel electrode layer 11 disposed on the base substrate sequentially. In the first non-light-transmitting region 22, the anti-reflection layer 3 is disposed between the base substrate 2 and the gate electrode 14. In the second non-light-transmitting region 23, the anti-reflection layer 3 is disposed between the base substrate 2 and the first metal electrode 15. Number of contact interfaces of the first non-transmitting region 22 and the second non-transmitting region 23 is increased, respectively. The backlight source cannot pass through the gate electrode 14 and the first metal electrode 15 originally, but after the backlight source is reflected by the contact interfaces between the base substrate 2 and the anti-reflection layer 3, by the contact interfaces between the anti-reflection layer 3 and the gate electrode 14, and by the contact interfaces between the anti-reflection layer 3 and the first metal electrode 15 many times, a part of the backlight source pass through the light-transmitting region 5 of the TFT array substrate 1. The transmittance of the backlight source in the light-transmitting region 5 of the TFT array substrate 1 is further improved.

In an embodiment, the anti-reflection layer 3 comprises a plurality of film layers (not shown) stacked on the base substrate 2 sequentially. Each of the film layers has a light refractive index greater than a light refractive index of the base substrate 2 and smaller than a light refractive index of the gate electrode insulating layer 4, wherein the refractive indexes of the plurality of film layers are increasing layer by layer in a direction toward the gate electrode insulating layer 4. Of course, the anti-reflection layer 3 can also consist of a single film layer.

Specifically, material of each of the film layers includes any one of silicon oxynitride (light refractive index ranging from 1.46 to 1.92), aluminum oxide (light refractive index ranging from 1.59 to 1.77), and a resin compound. Material of the anti-reflection layer 3 in the embodiment of the present application is not limited thereto.

In the present embodiment, the anti-reflection layer 3 consisting of the plurality of film layers whose light refractive indexes are increasing layer by layer improves the transmittance of light. The anti-reflection layer 3 is disposed between the base substrate 2 with a small refractive index of light (for example, a glass substrate having a refractive index of about 1.52) and the gate electrode insulating layer 4 with a large refractive index (for example, the gate electrode insulating layer 4 formed of silicon nitride having a refractive index of about 2.0), such that the light refractive indexes increases layer by layer from the base substrate 2 to the gate electrode insulating layer 4. Therefore, a backlight source in the light-transmitting region 5 of the TFT array substrate 1 enters an optically denser medium from an optically thinner medium to form a half-wave loss, so as to reduce reflected light energy. Reflectivity of the backlight source at each contact interface of the light-transmitting region 5 is reduced, thereby improving the transmittance of the backlight source in the light-transmitting region 5 of the TFT array substrate 1.

In an embodiment, a light refractive index of the anti-reflection layer 3 is n=$\sqrt{n_1 n_2}$, wherein n is the light refractive index of the anti-reflection layer 3, $n_1$ is a light refractive index of the base substrate 2, and $n_2$ is a light refractive index of the gate electrode insulating layer 4.

In the present embodiment, the refractive index of the anti-reflection layer 3 can be determined by the refractive index of the base substrate 2 and the gate electrode insulating layer 4, and material of the anti-reflective layer 3 can be selected in accordance with an obtained light refractive index by calculating.

In an embodiment, a thickness of the anti-reflection layer 3 is $$e = \frac{\lambda}{4n}(2k+1),$$

wherein e is the thickness of the anti-reflection layer 3, k is a natural number, and λ is a wavelength of green light having a wavelength of 550 nm. In the present embodiment, the thickness of the anti-reflection layer 3 is determined by the light refractive index of the anti-reflection layer 3 and the wavelength of light.

Figure 3:
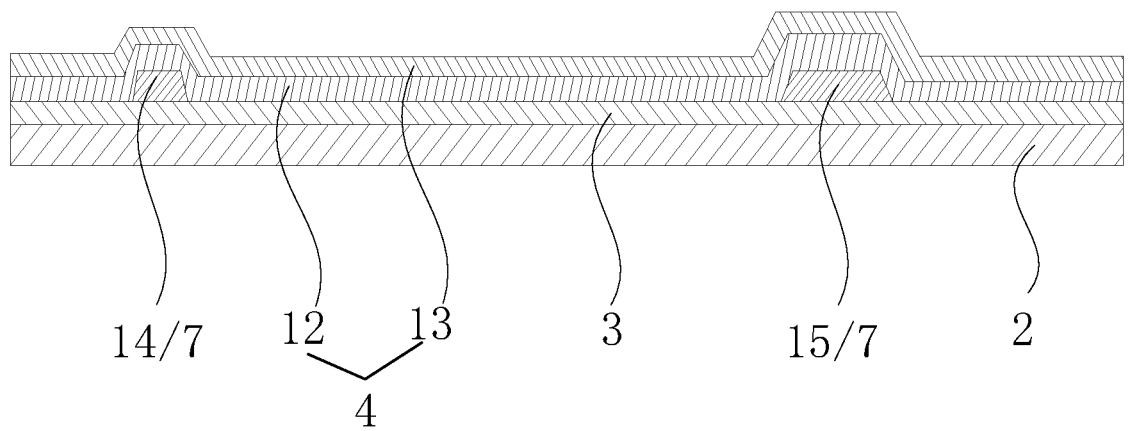
FIG. 3 is a partial structural schematic diagram of another thin film transistor (TFT) array substrate provided by an embodiment of the present application.

In an embodiment, as shown in FIG. 3, the gate electrode insulating layer 4 further comprises a first gate electrode insulating layer 12 and a second gate electrode insulating layer 13 disposed on the gate electrode layer 7 sequentially, wherein material of the first gate electrode insulating layer 12 and material of the second gate electrode insulating layer 13 are different. Specifically, material of the first gate electrode insulating layer 12 and the second gate electrode insulating layer 13 comprise silicon nitride or silicon oxide.

In the present embodiment, material of the first gate electrode insulating layer 12 and the second gate electrode insulating layer 13 comprise silicon nitride or silicon oxide, wherein the silicon nitride can effectively isolate oxygen to prevent the gate electrode layer 7 from being oxidized, and a deposited silicon oxide can effectively isolate hydrogen and prevent the semiconductor layer 8 from being reduced. Therefore, the double-layered gate electrode insulating layer 4 can protect the gate electrode layer 7 and can also protect the semiconductor layer 8.

In an embodiment, the above TFT array substrate 1 is prepared by the following steps of:

providing a base substrate 2;

forming an anti-reflection layer 3 on the base substrate 2 by a magnetron sputtering process or a vapor deposition process;

depositing a metal layer film (including molybdenum, aluminum or copper, etc.) on the anti-reflection layer 3 by a magnetron sputtering process, and forming a pattern of the gate electrode layer 7 by a yellow light process and a wet etching process;

forming a gate electrode insulating layer 4, a semiconductor layer 8 (including an a-Si semiconductor active layer 19 and an n+ a-Si ohmic contact layer 20) on the gate electrode layer 7 sequentially by a vapor deposition process; and forming the pattern of the a-Si semiconductor layer 8 by a yellow light process and a dry etching process;

depositing, by a magnetron sputtering process, a metal layer film (including molybdenum, aluminum or copper, etc.) on the base substrate 2 after the semiconductor layer 8 is formed, forming a pattern of a source/drain electrode layer 9 by a yellow light process and a wet etching process, and further etching the ohmic contact layer 20 at a channel of the source/drain electrode layer 9 through a dry etching process to obtain a TFT channel;

depositing, by a vapor deposition process, a non-metal layer film (including silicon nitride or silicon oxide, etc.) on the base substrate 2 after the source/drain electrode layer 9 is formed, and forming a via pattern of a passivation layer 10 by a yellow light process and a dry etching process; and forming, by a magnetron sputtering deposition process, an ITO (indium-tin oxide) thin film on the base substrate 2 after the passivation layer 10 is formed, and forming a pattern of the pixel electrode layer 11 by a yellow light process and a wet etching process.

In the present embodiment, the TFT array substrate 1 prepared by the above method is provided with the anti-reflection layer 3. Specifically, the anti-reflection layer 3 is disposed between the base substrate 2 and the gate electrode insulating layer 4, such that the refractive indexes of the base substrate 2, the anti-reflection layer 3, and the gate electrode insulating layer 4 are increasing sequentially, so that a backlight source in the light-transmitting region 5 of the TFT array substrate 1 enters an optically denser medium from an optically thinner medium to form a half-wave loss, so as to reduce reflected light energy. Therefore, a high reflection phenomenon of the backlight source at a contact interface between the base substrate 2 and the gate electrode insulating layer 4 with large difference in refractive index is avoided. Reflectivity of the backlight source at each contact interface of the light-transmitting region 5 is reduced, thereby improving the transmittance of the backlight source in the light-transmitting region 5 of the TFT array substrate 1. In addition, the anti-reflection layer 3 is also disposed between the base substrate 2 and the gate electrode layer 7, which increases number of interfaces between the base substrate 2 and the gate electrode layer 7. The backlight source cannot pass through the gate electrode layer 7 originally, but after the backlight source is reflected by the contact interfaces between the base substrate 2 and the anti-reflection layer 3 and by the contact interfaces between the anti-reflection layer 3 and the gate electrode layer 7 many times, a part of the backlight source pass through the light-transmitting region 5 of the TFT array substrate 1. The transmittance of the backlight source in the TFT array substrate 1 is further improved.

Figure 4:
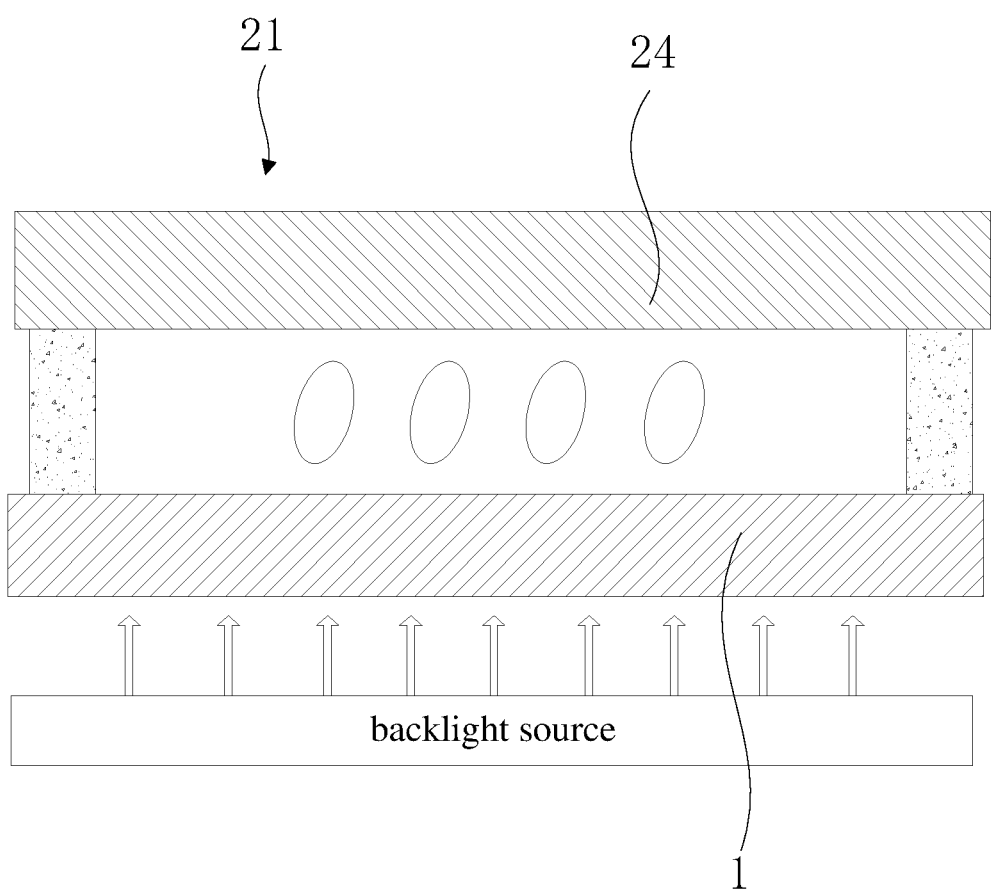
FIG. 4 is a structural schematic diagram of a display panel provided by an embodiment of the present application.

As shown in FIG. 4, an embodiment of the present application further provides a display panel 21 including the above TFT array substrate 1, a color filter substrate 24 cell-assembled to the TFT array substrate 1, a liquid crystal layer disposed between the TFT array substrate 1 and the color filter substrate 24, and a backlight source disposed on a side of the TFT array substrate 1 away from the color filter substrate 24.

In the present embodiment, the backlight source provides a light source from a side of the TFT array substrate 1 toward a side of the color filter substrate 24. An anti-reflection layer 3 is disposed between the base substrate 2 and the gate electrode insulating layer 4 located in the light-transmitting region 5 of the TFT array substrate 1. Refractive indexes of the base substrate 2, the anti-reflection layer 3, and the gate electrode insulating layer 4 are increasing sequentially, so that a backlight source in the light-transmitting region 5 of the TFT array substrate 1 enters an optically denser medium from an optically thinner medium to form a half-wave loss so as to reduce reflected light energy. Therefore, a high reflection phenomenon of the backlight source at a contact interface between the base substrate 2 and the gate electrode insulating layer 4 with large difference in refractive index is avoided. Reflectivity of the backlight source at each contact interface of the light-transmitting region 5 is reduced, thereby improving the transmittance of the backlight source in the light-transmitting region 5 of the TFT array substrate 1. In addition, the anti-reflection layer 3 is also disposed between the base substrate 2 and the gate electrode layer 7 located in the non-transmitting region 6 of the TFT array substrate 1, which increases number of interfaces between the base substrate 2 and the gate electrode layer 7. The backlight source cannot pass through the gate electrode layer originally, but after the backlight source is reflected by the contact interfaces between the base substrate 2 and the anti-reflection layer 3 and by the contact interfaces between the anti-reflection layer 3 and the gate electrode layer 7 many times, a part of the backlight source pass through the light-transmitting region 5 of the TFT array substrate 1. The transmittance of the backlight source in the TFT array substrate is further improved.

Figure 5:
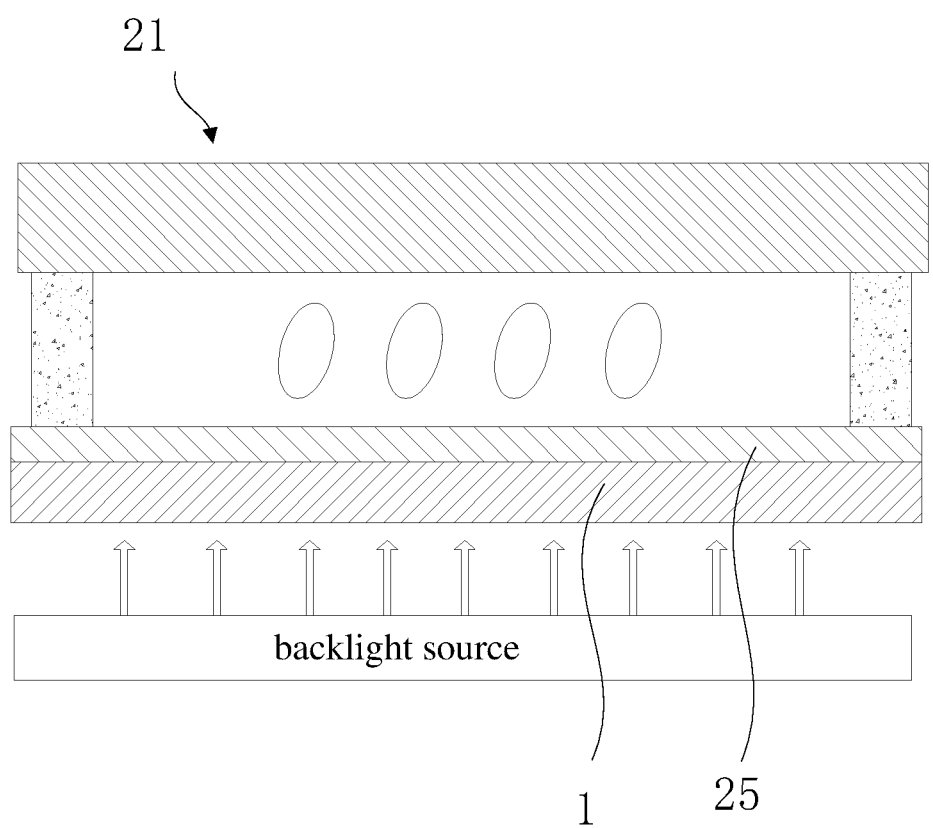
FIG. 5 is a structural schematic diagram of another display panel provided by an embodiment of the present application.

As shown in FIG. 5, an embodiment of the present application further provides a display panel 21 comprising the above TFT array substrate 1; and a color resist layer 25 disposed on the TFT array substrate 1. Specifically, the display panel 21 includes a display which has the color resist layer 25 disposed on the TFT array substrate 1 (color filter on array; COA) or a display which has a post spacer (PS) 25 disposed on the TFT array substrate 1 (PS on array; POA), wherein the color resist layer of the POA display panel is also disposed on the TFT array substrate.

In the present embodiment, the anti-reflection layer 3 of the TFT array substrate 1 is disposed between the base substrate 2 and the gate electrode insulating layer 4. A fabricating process of the anti-reflection layer 3, a fabricating process of the color resist layer 25, and a fabricating process of the spacer do not affect each other. Therefore, the above-described TFT array substrate 1 having high light transmittance can be applied to different types of display panels, including the COA display panel and the POA display panel.

As described above, although the present application has been disclosed in the preferred embodiments as above, the above preferred embodiments are not intended to limit the present application. Those skilled in the art can make various changes and modifications without departing from the spirit and scope of the present disclosure. Therefore, the protection scope of the present application is defined by the scope of the claims.

What is claimed is:

1. A thin film transistor (TFT) array substrate, comprising: a base substrate, an anti-reflection layer, and a gate electrode insulating layer, wherein the TFT array substrate comprises a light-transmitting region, the anti-reflection layer is disposed on the base substrate located in the light-transmitting region, and the gate electrode insulating layer is disposed on the anti-reflection layer, wherein light refractive indexes of the base substrate, the anti-reflection layer, and the gate electrode insulating layer are increasing sequentially, and wherein the anti-reflection layer comprises a plurality of film layers stacked on the base substrate sequentially, each of the film layers having a light refractive index greater than a light refractive index of the base substrate and smaller than a light refractive index of the gate electrode insulating layer, wherein the refractive indexes of the plurality of film layers are increasing layer by layer in a direction toward the gate electrode insulating layer.

2. The TFT array substrate according to claim 1, further comprising a non-light-transmitting region, wherein the anti-reflection layer is further disposed on the base substrate located in the non-light-transmitting region, a gate electrode layer is disposed on the anti-reflection layer located in the non-light-transmitting region, and the gate electrode insulating layer is further disposed on the gate electrode layer.

3. The TFT array substrate according to claim 2, further comprising a semiconductor layer, a source/drain electrode layer, a passivation layer, and a pixel electrode layer disposed on the gate electrode insulating layer sequentially.

4. The TFT array substrate according to claim 3, wherein the non-light-transmitting region comprises a first non-light-transmitting region and a second non-light-transmitting region, the gate electrode layer comprises a gate electrode and a first metal electrode, and the source/drain electrode layer comprises a source electrode, a drain electrode, and a second metal electrode, wherein the TFT array substrate located in the first non-light-transmitting region comprises the anti-reflection layer, the gate electrode, the gate electrode insulating layer, the semiconductor layer, the source electrode, the drain electrode, the passivation layer, and the pixel electrode layer, all of which are disposed on the base substrate sequentially, and the TFT array substrate located in the second non-light-transmitting region comprises the anti-reflection layer, the first metal electrode, the gate electrode insulating layer, the second metal electrode, the passivation layer, and the pixel electrode layer, all of which are disposed on the base substrate sequentially.

5. The TFT array substrate according to claim 2, wherein the gate electrode insulating layer further comprises a first gate electrode insulating layer and a second gate electrode insulating layer disposed on the gate electrode layer sequentially, wherein material of the first gate electrode insulating layer and material of the second gate electrode insulating layer are different.

6. The TFT array substrate according to claim 5, wherein material of the first gate electrode insulating layer and material of the second gate electrode insulating layer comprise silicon nitride or silicon oxide.

7. The TFT array substrate according to claim 1, wherein material of each of the plurality of film layers comprises any one of silicon oxynitride, aluminum oxide, and a resin compound.

8. The TFT array substrate according to claim 1, wherein a light refractive index of the anti-reflection layer is $n = \sqrt{n_1 n_2}$, wherein n is the light refractive index of the anti-reflection layer, $n_1$ is a light refractive index of the base substrate, and $n_2$ is a light refractive index of the gate electrode insulating layer.

9. The TFT array substrate according to claim 8, wherein a thickness of the anti-reflection layer is $$e = \frac{\lambda}{4n}(2k+1),$$

wherein e is the thickness of the anti-reflection layer, k is a natural number, and λ is a wavelength of green light having a wavelength of 550 nm.

10. The TFT array substrate according to claim 1, wherein a fabrication process of the anti-reflection layer comprises a magnetron sputtering process or a vapor deposition process.

11. A display panel, comprising the TFT array substrate according to claim 1; and a color filter substrate cell-assembled to the TFT array substrate.

12. A display panel, comprising the TFT array substrate according to claim 1; and a color resist layer disposed on the TFT array substrate.

* * * * *